United States Patent [19]

Wingenfeld et al.

[11] Patent Number: 4,952,296
[45] Date of Patent: Aug. 28, 1990

[54] DEVICE FOR SELECTIVE GALVANIC COATING

[76] Inventors: Peter Wingenfeld, Degenfelderstrasse 26/2, 7070 Weiler; Dietmar Holdt, Staufenstrasse 19, 7078 Leinzell, both of Fed. Rep. of Germany

[21] Appl. No.: 434,405

[22] Filed: Nov. 13, 1989

[30] Foreign Application Priority Data

Nov. 19, 1988 [DE] Fed. Rep. of Germany ....... 3839223

[51] Int. Cl.⁵ .............................................. C25D 17/14
[52] U.S. Cl. .................................. 204/206; 204/224 R
[58] Field of Search ........................... 204/206, 224 R

[56] References Cited

U.S. PATENT DOCUMENTS 4,452,684  6/1984  Palnik ................................. 204/206
4,786,389 11/1988  Moffitt ............................... 204/206

Primary Examiner—T. M. Tufariello

[57] ABSTRACT

An anode provide with edges into which strips of an electrolytic carrier are sunk in the vicinity of the anode edges. These carrier strips are used for the selective galvanic coating of objects. The anode edge and the electrolytic carrier are connected to a band of a liquid-permeable, adsorbent and wear-resistant material which closely surrounds the anode. This band is used to fasten the carrier to the anode in a fold-free, bulge-free manner.

15 Claims, 4 Drawing Sheets

DEVICE FOR SELECTIVE GALVANIC COATING

BACKGROUND OF THE INVENTION

The invention relates to a device for the selective galvanic coating of electrically conductive objects which are guided in a continuous or discontinuous manner past a rod-like anode. The rod-like anode is provided in its cross section with one or several edges. The objects are selectively coated by bringing them into contact with an electrolyte distributed on an electrolytic carrier.

Metallic strip products for use in the electronics industry, such as contact pins, contact springs or contact bands must be coated galvanically, preferably in a partially coated manner. This coating is especially important for noble metals in order to improve their electric properties, hardness or wear resistance for contacting important points.

This type of coating usually takes place by means of stationary or movable diffusion masks as described e.g. in U.S. Pat. Nos. 4,132,617; 4,425,212; WO-OS No. 87/02 076 and DE-OS No. 29 28 904. The production cost and the equipment cost of the marking technique is very high and expensive. Electrolyte losses due to it being drained off the outside of the apparatus are difficult to avoid. Furthermore, it is difficult to maintain the required tolerances, which are a function of the temperature change, deformation or changes in length. Maintenance of these factors, and thus maintenance of the required tolerance, is either not assured or only assured to an unsatisfactory extent.

U.S. Pat. No. 4,610,772 and EP-OS No. 1 154 795 teach methods of coating electrically conductive objects in which the objects to be selectively coated are guided past anodically connected, rotating rollers. The rollers are provided with coatings of adsorbent fabrics. The roller is immersed in the electrolyte or the roller is otherwise supplied with the electrolyte solution.

The transfer of the metal onto the objects takes place by bringing the metallic objects in contact with the fabric impregnated with electrolyte. A disadvantage of this is an insufficient definition and insufficient evenness of the layers. In most instances, additional masking or adhesive must be used in order to protect areas which are not to be coated.

U.S. Pat. No. 4,452,684 describes a method in which the objects are guided past a stationary, porous body and the electrolyte is supplied via a hollow shaft. Uneven separations and layer thicknesses likewise result on account of the loading on all sides with electrolyte.

DE-PS No. 37 30 740 teaches a method for the selective, galvanic coating of objects guided in a continuous manner past an anode. The coating takes place by means of bringing the objects in contact with an electrolytic carrier on which the electrolyte is distributed. The electrolytic carrier has defined edges and the electrolyte is applied over a level surface thereof. The carrier is connected to the anode and is put into mechanical oscillations. The coatings are not sufficiently contour-defined here for specialized applications.

SUMMARY OF THE INVENTION

One object of the present invention is to develop a device for the selective, galvanic coating of electrically conductive objects. This device assures an even distribution of the layers and a sharp limitation of the layers without a masking media. This device also assures that different objects can be coated in a continuous or discontinuous manner, at a high separating speed, with a small electrolyte volume.

The invention achieves this and other objects by means of a special electrolyte carrier and anode construction. The rod-like anode is provided with one or several edges. In the longitudinal direction of the anode, one or two electrolytic carriers are aligned parallel to the edges. The electrolytic carriers terminate flush with the anode surface and are sunk into the anode body as strips. The electrolytic carrier or carriers is (are) connected to a band comprising a liquid-permeable, adsorbent and wear-resistant material. The band closely surrounds the anode edge, either in part or over its entire length, and it prevents electrical short circuits.

It has proven to be advantageous if the band can be opened and closed by means of a hook-and-pile type fastener or other suitable strip fastener. If a uniform tensioning of the band takes place by means of a tensioning device, folds or bulgings are avoided. Felts, fabrics or knitted fabrics of natural or artificial fibers can be used as material for the band and the electrolytic carrier.

The cross-sectional geometry of the anode body can be segment-shaped or semicircular in the shape of a sector of a circle, but a triangular cross section is advantageous. Any corrosion-resistant material may be used as the anode body, such as high grade steels, stainless steel, or titanium.

Electrolyte supply conduits in or on the anode body are especially suitable for the supply of electrolyte and are filled with an adsorbent, liquid-permeable material. This material is advantageously suited as an electrolyte collector body and as an additional filter. The electrolyte supply conduits are connected to each other and to the electrolytic carrier along the entire anode body via connecting conduits and are supplied with the electrolyte fluid. The supply of the electrolyte from a storage container to the electrolyte supply conduits preferably takes place via a connection on both front surfaces. An additional advantage can be realized if the electrolyte supply conduits are provided with a heating device. The heating medium can be water; however, a bypass line from the electrolyte supply container without an additional consumption of energy is advantageous. The advantage of heating the electrolyte is that a uniform temperature is present everywhere on the anode edge and the large-area anode cannot function as a cooling body.

It is also advantageous to place the electrolytic carrier strips very close to the nearest anode edge in order to achieve additional positive flow properties of the electrolyte.

It is also advantageous for the regulation of the flow of the electrolyte to provide the connection conduits with replaceable nozzles. The nozzles assure a uniform moistening with liquid and a set electrolyte volume in the area of the anode edge of the electrolytic carrier.

This invention results in the economic advantage that the work can be performed with a relatively small volume of noble-metal electrolyte. There is an additional advantage the coating may be very selectively located As a rule, in the prior art devices, electrolyte volumes of approximately 120–125 liters are required. Volumetric savings of up to 80% are achieved with the use of the device of the invention.

BRIEF DESCRIPTION OF THE DRAWINGS

These and other objectives of the invention will become more evident when viewed in connection with the following figures and detailed description.

DETAILED DESCRIPTION OF THE PREFERRED EMBODIMENT

Figure 1:
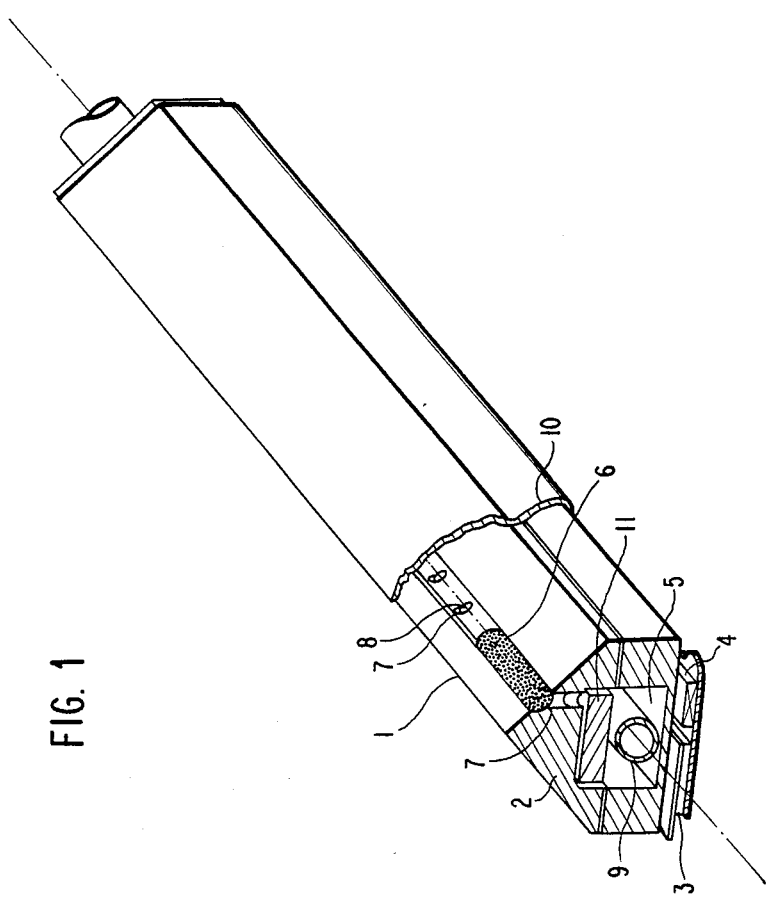
FIG. 1 shows one embodiment of the anode body.
Figure 2:
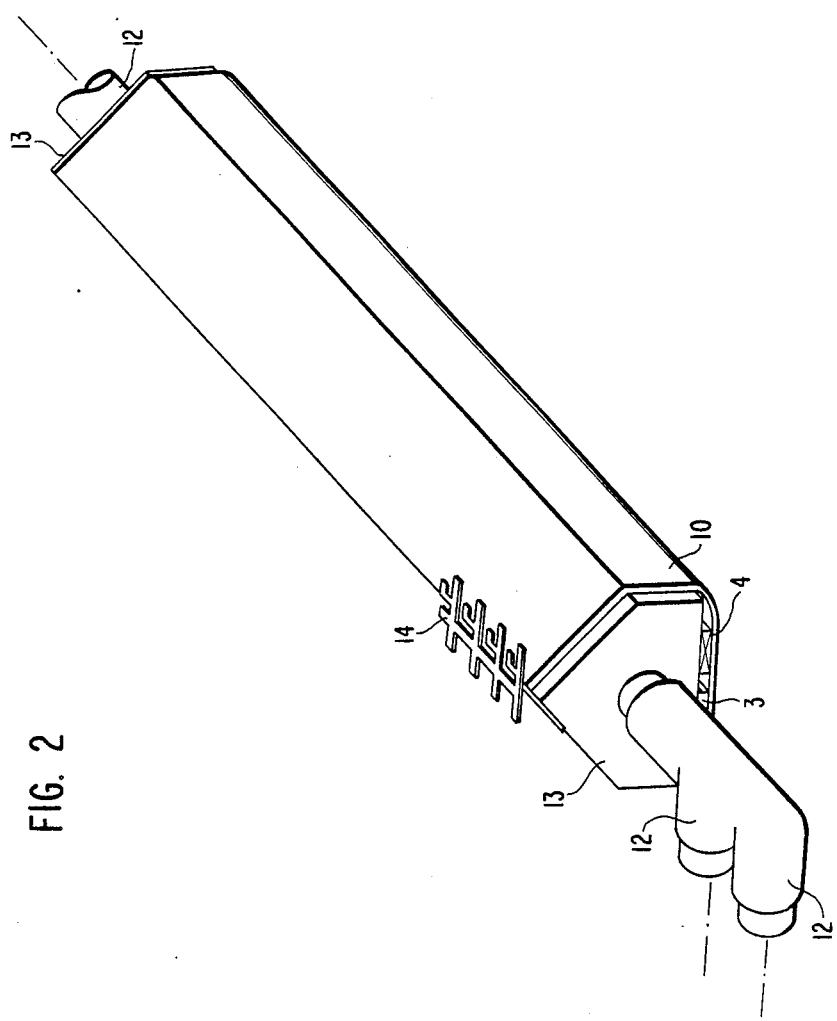
FIG. 2 shows the apparatus with supply lines and the frontal connection plates.

The device comprises a rod-like anode body 2 which has one or several anode edges 1, as shown in FIG. 1. The anode may be constructed from high-grade steels, stainless steel, titanium, or other metals which are known in the art. The objects 14 to be coated are guided along these edges 1 (see FIG. 2).

A liquid-permeable band 10 is located between anode edge 1 and object 14 to be coated. This band 10 is connected to electrolytic carrier 6 which is inserted into anode body 2. The electrolyte carrier strips 6 are typically located from 1-20 mm from the anode edge 1, as measured from the edge of the strip nearest to the anode edge to the anode edge. It has been found that the flow of electrolyte to the piece to be coated improves when the carrier 6 is placed as close as possible to the anode edge 1.

Hook and pile strip fastener 3 (e.g., VELCRO) and tensioning device 4 are used to close and open band 10 and to provide a fold free and draw free tension. The electrolyte is introduced into the anode body 2 via supply connections 12 (see FIG. 2). The electrolyte is supplied under pressure, for example, via a pump (not shown). Connections 12 are located at both front connection plates 13. The electrolyte passes through electrolyte supply conduit 5 into connection conduits 7, via adsorbent material 11.

The electrolyte is supplied with the aid of replaceable nozzles 8 to electrolytic carrier 6 and passes to the outside via band 10 on anode edge 1. This anode edge 1 is uniformly moistened with electrolyte and is brought into contact with the surface areas of the electrically conductive objects 14 to be coated. This electrolyte, placed on the anode edge 1, assures a high degree of selectivity. In order to assure a uniform temperature of the electrolyte, a heating device 9 may be introduced into electrolyte supply conduits 5. The heating can be operated by means of electric heating rods or with heating tubes filled with hot liquid, or by other known heating means.

The particular electrolyte used in conjunction with this invention is not critical to the invention itself. Various electrolytic solutions may be used. Examples of such electrolytes are salt solutions of gold sold under the trademarks AURUNA 7000 and AURUNA 7100 (available from Degussa). Other electrolytes may be used in conjunction with this invention.

Figure 3:
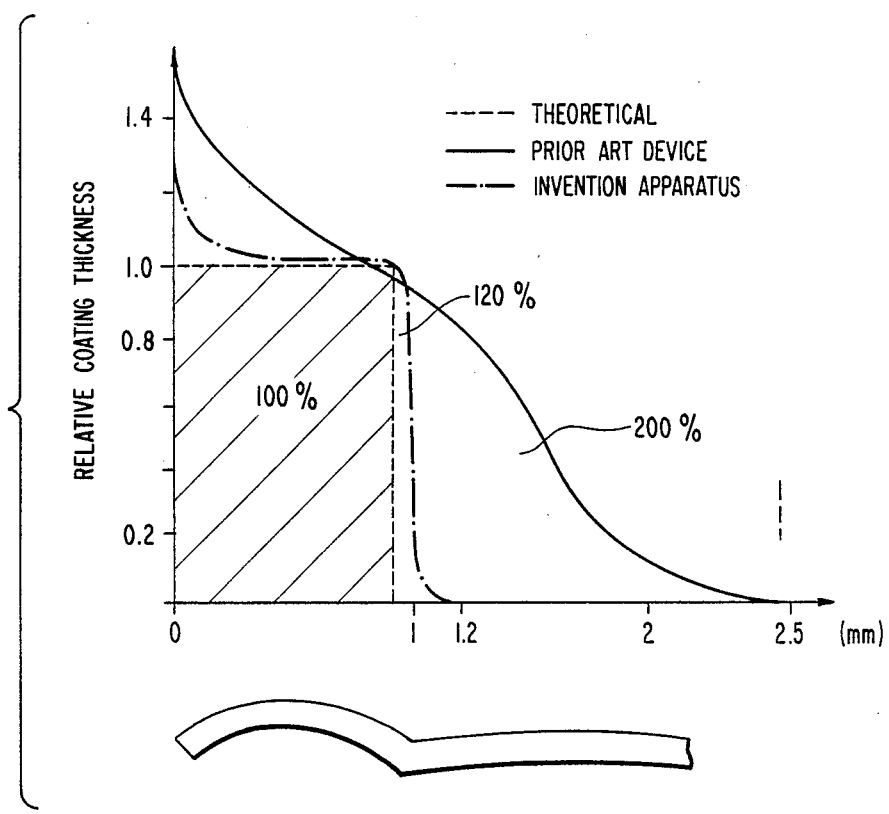
FIG. 3 shows a comparison of the coating device of the invention and the prior art devices.

This device achieves a highly reduced consumption of metal. Compared to currently customary selective techniques, it achieves savings of metal up to 80%. FIG. 3 shows a graph of the relative coating thickness across a length of an object to be coated. The ideal coating is shown by the rectangular box enclosing the 100% area in the Figure. The prior art coating devices are shown by the solid line (200% area). Note the unevenness of the coating thickness over the entire length of the article. There is a dramatic savings of electrolyte when the apparatus of this invention is used. The coating of this invention is shown in the area under the curve labeled 120%. The selective placement of the electrolyte solution and the savings of the electrolyte are evident from the Figure. A further advantage resides in the fact that when gold is layered on cutting edges and on the back side, for example, only a negligible gold flash is separated, which eliminates the need for restripping away the unnecessary coating.

Figure 4:
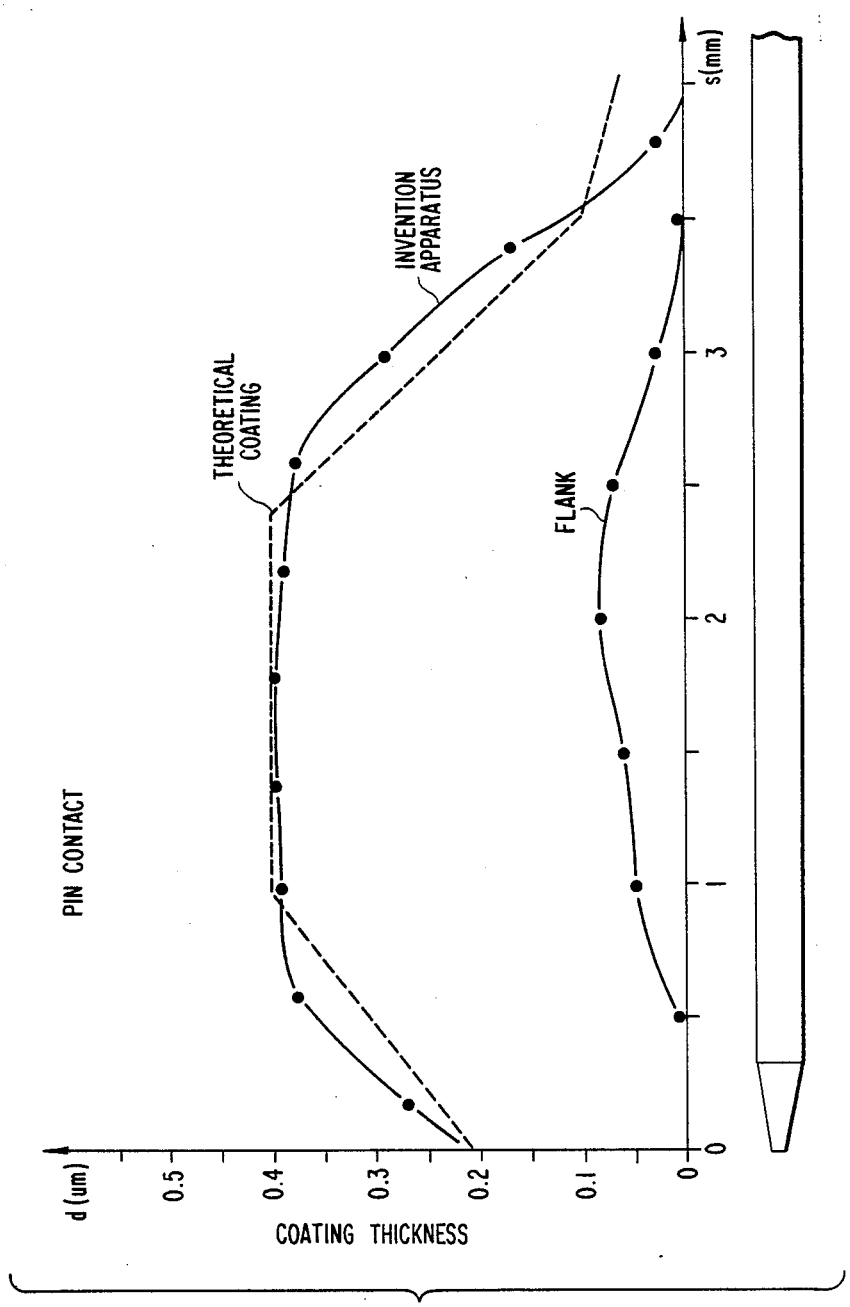
FIG. 4 is a graph showing the selective coating ability of the invention.

FIG. 4 shows a graph of the coating thickness over a partially coated contact pin. Typically, in the electronics industry, electronic devices require narrow lines of conductor material to use as electrical contacts. FIG. 4 shows the thickness of galvanic coating of an ideal electrical contact on a contact pin, represented by the dashed line. The solid line shows the thickness of galvanic coating deposited on a contact pin by the apparatus of the invention. It is evident from the Figure how this invention closely approximates the ideal coating thickness.

FIG. 4 also shows a measure of the thickness of the coating material that drains over the edges of the contact onto its flanks. This shows that very little electrolyte runs over the sides. This efficient apparatus for coating reduces the production costs of the coated workpiece by substantially reducing the wasted electrolyte.

While the invention has been described in accordance with the particular embodiment shown in the figures, various changes or modifications may be made without departing from the spirit and scope of the invention as defined in the claims.

We claim:

1. An apparatus for the selective, galvanic coating of electrically conductive objects comprising a rod-like anode, said anode having a body and provided in its cross section with one or more edges, said edges being in contact with an electrolyte distributed on at least one electrolytic carrier, wherein said at least one electrolytic carriers are sunk into the anode body as strips terminating substantially flush with the anode surface in the immediate vicinity of said one or more anode edges, said strips parallel to a longitudinal direction of said anode, parallel to the edges, and that the electrolytic carriers are connected to a band comprising a liquid-permeable, adsorbent and wear-resistant material which closely surrounds the one or more anode edges, wherein the objects are coated by passing the objects along said one or more edges of the rod-like anode.

2. An apparatus according to claim 1, wherein the band closely surrounds the entire cross section of the anode body.

3. An apparatus according to claim 1, wherein the band is provided with a hook-and-pile type fastener and with a tensioning device.

4. An apparatus according to claim 1, wherein the anode body exhibits a triangular cross section.

5. An apparatus according to claim 1, wherein electrolyte supply conduits are located in or on the anode body, said supply conduits are filled with an adsorbent, liquid permeable material and that these electrolyte supply conduits are connected along the entire anode body to the electrolytic carrier through connecting conduits.

6. An apparatus according to claim 5, wherein the electrolyte supply conduits are provided at both front surfaces of the anode body, said supply conduits further having connections for the supply of the electrolyte.

7. An apparatus according to claim 5, wherein the electrolyte supply conduits are provided with a heating device.

8. An apparatus according to claim 1, wherein the electrolytic carrier strips are located at a distance of 1 to 20 mm from the anode edge, measured from the electrolyte carrier strip border closest to the anode edge.

9. An apparatus according to claim 5, wherein the connecting conduits are provided with replaceable nozzles.

10. An apparatus according to claim 1, wherein the objects are guided past the anode in a continuous manner.

11. An apparatus according to claim 1, wherein the objects are guided past the anode in a discontinuous manner.

12. An apparatus according to claim 1, wherein there are two electrolytic carriers.

13. An apparatus according to claim 1, wherein there is one electrolytic carrier.

14. An apparatus according to claim 1, wherein said band surrounds said anode over its entire length.

15. An apparatus according to claim 1, wherein said band surrounds said anode over part of its length.

* * * * *